(12) United States Patent
Voraberger et al.

(10) Patent No.: US 8,541,690 B2
(45) Date of Patent: Sep. 24, 2013

(54) METHOD FOR FIXING AN ELECTRONIC COMPONENT ON A PRINTED CIRCUIT BOARD AND SYSTEM COMPRISING A PRINTED CIRCUIT BOARD AND AT LEAST ONE ELECTRONIC COMPONENT

(75) Inventors: Hannes Voraberger, Graz (AT); Gerhard Schmid, Trofalach (AT); Markus Riester, Seiersberg (AT); Johannes Stahr, Bruck (AT)

(73) Assignee: AT & S Austria Technologie & Systemtechnik Aktiengesellschaft, Leoben-Hinterberg (AT)

( * ) Notice: Subject to any disclaimer, the term of this patent is extended or adjusted under 35 U.S.C. 154(b) by 746 days.

(21) Appl. No.: 12/227,364

(22) PCT Filed: May 15, 2007

(86) PCT No.: PCT/AT2007/000234
§ 371 (c)(1),
(2), (4) Date: Nov. 14, 2008

(87) PCT Pub. No.: WO2007/131256
PCT Pub. Date: Nov. 22, 2007

(65) Prior Publication Data
US 2009/0101398 A1 Apr. 23, 2009

(30) Foreign Application Priority Data
May 16, 2006 (AT) ................. GM 393/2006

(51) Int. Cl.
*H05K 1/16* (2006.01)
*H05K 1/18* (2006.01)
(52) U.S. Cl.
USPC ........................................................ 174/260
(58) Field of Classification Search
USPC ........................................................ 174/260
See application file for complete search history.

(56) References Cited

U.S. PATENT DOCUMENTS 3,660,726 A * 5/1972 Ammon et al. ............... 174/262
5,479,319 A * 12/1995 Werther ........................ 361/784
(Continued)

FOREIGN PATENT DOCUMENTS

JP 11-068288 3/1999
JP 2002-033562 1/2002
(Continued)

OTHER PUBLICATIONS

International Search Report dated Feb. 29, 2008.

*Primary Examiner* — Timothy Thompson
*Assistant Examiner* — Nathan Milakovich
(74) *Attorney, Agent, or Firm* — Jacobson Holman PLLC (57) ABSTRACT

A method for fixing an electronic component on a printed circuit board, and contact-connecting the electronic component to the printed circuit board, the following steps are provided:—providing the printed circuit board having a plurality of contact and connection pads,—providing the electronic component having a number of contact and connection locations corresponding to the plurality of contact and connection pads, with a mutual spacing reduced in comparison with the spacing of the contact and connection pads, and—arranging or forming at least one interlayer for routing the contact and connection locations of the electronic component between the contact and connection pads and the contact and connection locations of the electronic component. A method for producing an interlayer for routing and a system having a printed circuit board and an electronic component using the interlayer for routing are also provided.

21 Claims, 7 Drawing Sheets

(56) References Cited

U.S. PATENT DOCUMENTS

| | | | |
|---|---|---|---|
| 5,886,409 A * | 3/1999 | Ishino et al. | 257/737 |
| 6,034,437 A * | 3/2000 | Shibata | 257/783 |
| 6,297,553 B1 * | 10/2001 | Horiuchi et al. | 257/737 |
| 6,309,912 B1 * | 10/2001 | Chiou et al. | 438/118 |
| 6,335,491 B1 | 1/2002 | Alagaratnam et al. | |
| 6,388,335 B1 * | 5/2002 | Lam | 257/778 |
| 6,429,534 B1 | 8/2002 | Low et al. | |
| 6,493,056 B2 * | 12/2002 | Bjorkengren et al. | 349/151 |
| 6,671,947 B2 * | 1/2004 | Bohr | 29/846 |
| 7,002,075 B2 * | 2/2006 | Kambe et al. | 174/565 |
| 7,462,784 B2 * | 12/2008 | Kariya et al. | 174/260 |
| 7,566,960 B1 * | 7/2009 | Conn | 257/686 |
| 7,994,432 B2 * | 8/2011 | Kariya et al. | 174/260 |
| 8,008,583 B2 * | 8/2011 | Kariya et al. | 174/260 |
| 8,373,073 B2 * | 2/2013 | Ito et al. | 174/260 |
| 2004/0014317 A1 * | 1/2004 | Sakamoto et al. | 438/689 |
| 2005/0023033 A1 * | 2/2005 | Saiki et al. | 174/260 |
| 2005/0103522 A1 * | 5/2005 | Grundy et al. | 174/260 |
| 2005/0133891 A1 | 6/2005 | Beroz et al. | |
| 2005/0136634 A1 * | 6/2005 | Savastiouk et al. | 438/597 |
| 2005/0218528 A1 | 10/2005 | Beatty et al. | |
| 2006/0035510 A1 | 2/2006 | Numata et al. | |
| 2006/0079079 A1 * | 4/2006 | Muthukumar et al. | 438/618 |
| 2007/0076348 A1 * | 4/2007 | Shioga et al. | 361/307 |
| 2009/0101896 A1 * | 4/2009 | Shinagawa | 257/48 |
| 2012/0247819 A1 * | 10/2012 | Tsuyutani et al. | 174/257 |

FOREIGN PATENT DOCUMENTS

| | | |
|---|---|---|
| JP | 2002-246759 | 8/2002 |
| JP | 2006-066597 | 3/2006 |
| JP | 2006-080571 | 3/2006 |
| WO | 01/43190 | 6/2001 |
| WO | WO 01/43190 | 6/2001 |

* cited by examiner

METHOD FOR FIXING AN ELECTRONIC COMPONENT ON A PRINTED CIRCUIT BOARD AND SYSTEM COMPRISING A PRINTED CIRCUIT BOARD AND AT LEAST ONE ELECTRONIC COMPONENT

This is a national stage of PCT/AT07/000,234 filed May 15, 2007 and published in German, which has a priority of Austria no. GM 393/2006 filed May 16, 2006, hereby incorporated by reference.

FIELD OF THE INVENTION

The present invention relates to a process for attaching or fixing an electronic component on a circuit board and/or contacting the electronic component with the circuit board, as well as a process for producing an intermediate layer for disentangling contact or connection sites of an electronic component from contact or connection surfaces of a circuit board. The present invention further relates to a system including a circuit board and at least one electronic component.

PRIOR ART

Electronic components to be applied on circuit boards have become increasingly complex, which has, above all, resulted in an increase of the required number of connections to the circuit board, which has in turn led to a reduction of the distances between individual or neighboring connections such as, for instance, conductive pins with an unchanged size of the electronic component. In this connection, printed circuit board manufacturers started to perform disentanglements of such components, or individual components, via conductive passages or microvias through several circuit board layers in so-called high-density interconnects or HDI boards or printed boards.

With a further increase in the complexity of electronic components and the thus involved increase in the number of connections to a circuit board, and/or a further reduction of the dimensions of such electronic components, which will likewise lead to reduced distances between neighboring connections, a large increase in the number of circuit board layers is expected for the necessary disentanglement. Moreover, an increase in the complexity of such an electronic component together with reduced mutual distances linked with enhanced connections will minimize the options for realizing or arranging conductive tracks or conductive structures between individual connections, or render an arrangement impossible at all, which will immediately call for a further increase in the number of necessary circuit board layers. Additional layers of such a circuit board will, however, result in an increased thickness of the circuit board and, moreover, in increased production costs.

A way of reducing the number of circuit boards is by using very fine or ultra-fine conductive structures, wherein, however, for the time being, even with the possible availability of processes for producing such fine or ultra-fine conductive structures, it is to be anticipated that the production of multilayer circuit boards including such ultra-fine conductive structures in usual production formats of high-density interconnects, such as, e.g., 18×24 inch, does not enable the orientation of circuit board layers with sufficient precision in order to, for instance, provide conductive connections between individual board layers where such ultra-fine conductive tracks or conductive structures are provided.

From WO 01/43190 A1 there has become known a liquid crystal display, wherein a substrate having connecting or contact surfaces is coupled or connected with an electronic component by using an intermediate device.

From US 2005/0133891 A1 there has become known a system consisting of a circuit board or printed circuit board and an electronic component, wherein the electronic component is coupled with the circuit board or the substrate via intermediate connecting locations. Moreover, from U.S. Pat. No. 6,429,534 B1 there can be taken a frame-like element for coupling a circuit board and an electronic component to be fixed on the circuit board, wherein the frame-like element surrounds the electronic component being fixed on the circuit board and a coupling is provided between the connecting locations or sites of the electronic component facing away from the circuit board and respective connecting or contact surfaces of the circuit board by wire connections, which are provided between the connecting or contact surfaces of the electronic component and respective wiring paths or tracks on the frame-like element on the one side and between the wiring paths on the frame-like element and the respective contact surfaces of the circuit board on the other hand, so that much effort is necessary for coupling the connecting areas of the electronic component with respective or dedicated connecting areas of the circuit board by arranging a very large number of wire connections.

SUMMARY OF THE INVENTION

Based on a process of the initially defined kind as well as a system of the initially defined kind, the present invention, therefore, aims to avoid the above-mentioned problems with regard to the use of electronic components of increased complexity and/or reduced size, and hence the reduction of the small mutual distances between connections to the circuit board, by a substantially unchanged circuit board design and, in particular, to enable the disentanglement of such highly complex components of, in particular, small dimensions while avoiding additionally required circuit board layers.

To achieve the above-mentioned objects, a process for attaching or fixing an electronic component on a circuit board and/or contacting the electronic component with the circuit board is essentially characterized by the steps of:
  providing the circuit board with a plurality of contact or connection surfaces;
  providing the electronic component with a number of contact or connection sites corresponding to the plurality of contact or connection surfaces of the circuit board, at mutual distances reduced relative to the distances of the contact or connection surfaces of the circuit board; and
  arranging or forming between the contact or connection surfaces of the circuit board and the contact or connection sites of the electronic component at least one intermediate layer for disentangling the contact or connection sites of the electronic component.

Due to the fact that according to the invention, after having provided the circuit board or printed circuit board with a plurality of contact or connection surfaces and the electronic component with a corresponding number of contact or connection sites, an or at least one intermediate layer for disentangling the contact or connection sites of the electronic component is arranged or formed between the contact or connection surfaces of the circuit board and the associated contact or connection sites of the electronic component, it has become feasible to couple with, or attach to, the circuit board, or contact the latter with, an electronic component comprising an optionally higher complexity and, consequently, a larger number of connections to the circuit board at simultaneously reduced distances between the individual connections, and/or an electronic component having reduced dimensions, without increasing the number of circuit board layers for the disentanglement between the connection sites of the electronic component and the connection sites or surfaces of the circuit board. The intermediate layer provided according to the invention may have a thickness reduced relative to the thickness of a circuit board layer, particularly of the dielectric layer or film, such that a negligible increase in the thickness of the entire circuit board will do, particularly in consideration of the fact that a circuit board of this type would usually comprise a plurality of, for instance, more than 4 and, in particular, more than 6 circuit board layers, while, at the same time, enabling the safe disentanglement in a preferably single layer or ply of the intermediate layer. If highly complex components including extremely large numbers of contact or connection sites are employed, more than one intermediate layer including the respective feedthroughs may be provided, wherein, however, even with the provision of more than one intermediate layer, unalteredly great advantages relative to the provision of an elevated number of additional board layers will be attainable, bearing in mind the strongly reduced thickness as compared to conventional circuit boards and the simplified structuring of the circuit board.

It is, thus, feasible to resort to presently available techniques for forming circuit boards having a plurality of circuit board layers, in particular when taking into account the precision requirements for the alignment of individual subregions of such circuit board layers, while the appropriate, very fine or ultra-fine conductive tracks or structures may be provided in the region of the intermediate layer for disentanglement, while accordingly large partial regions or contact zones may be provided on the intermediate layer for the respective contacting or connection of the contact or connection sites of the electronic component as well as the connection or contact surfaces of the circuit boards.

As already indicated above, it will do for disentanglement to use an intermediate layer having a simplified structure as compared to usual circuit board layers, it being preferably proposed in this respect that the intermediate layer is formed with conductive tracks or structures between contact zones corresponding to the contact or connection sites of the electronic component and corresponding to the contact or connection surfaces of the circuit board. Since the intermediate layer is merely formed with conductive tracks or structures between contact zones corresponding to the contact or connection sites of the electronic component and corresponding to the contact or connection surfaces of the circuit board, the arrangement or formation of very fine or ultra-fine conductive tracks or structures may be provided, which can, for instance, be formed by known techniques on or in the intermediate layer such that the mutual distances of the connections of such components, which are reduced when using complex components, do not constitute any restriction in view of the possibility of realizing or providing conductive tracks in the intermediate layer.

In order to ensure reliable contacting between the electronic component and the intermediate layer for disentanglement, it is proposed according to a preferred embodiment that contacting between the contact or connection sites of the electronic component and the intermediate layer is realized via contacts of the electronic component.

According to a modified embodiment, it is preferably proposed by the invention that contact or connection sites of the electronic component are directly contacted with contact zones of the intermediate layer, thus enabling a further reduction of costs for the attachment of the electronic component to the circuit board, and also an improved connection or fixation of electronic components on a circuit board while interposing the intermediate layer for disentanglement, by a reduction of connections, for instance welds or bonds.

According to a further preferred embodiment, it is proposed that the intermediate layer is merely formed in the region of the contact or connection surfaces of the circuit board as well as the contact or connection sites of the electronic component, so that accordingly reduced material expenditures will be involved in the formation of the intermediate layer, since the latter merely need be provided in the region of the attachment of the or an electronic component on the circuit board while, at the same time, taking into account the increased distances between the individual contact or connection surfaces of the circuit board relative to the distances of the contact or connection sites of the electronic component.

For a further cost reduction and/or formation of a compact overall structure, in particular when assembling the electronic component and the circuit board, it is proposed according to a further preferred embodiment that the electronic component is attached on the circuit board with contact or connection surfaces oriented away from the circuit board, and is overlaid by the intermediate layer for disentanglement and connection to the contact or connection surfaces of the circuit board. Thus, in addition to offering the chance of disentanglement via the intermediate layer having an extremely small thickness, also a supporting function for the electronic component will be fulfilled such that an additional carrier substrate for the electronic component will be obviated so as to not only enable a reduction of the size of the overall system comprised of the circuit board and the at least one electronic component, but also a reduction of the overall costs.

To achieve the objects mentioned in the beginning, a process for producing an intermediate layer for disentangling contact or connection sites of an electronic component from contact or connection surfaces of a circuit board is, moreover, essentially characterized by the steps of:

providing the circuit board with a plurality of contact or connection surfaces;

forming a base material of the intermediate layer at least in the region of the contact or connection surfaces of the circuit board;

structuring the intermediate layer to form conductive tracks or structures and contact sites for contacting with contact or connection surfaces of the circuit board and with contact or connection sites of an electronic component to be attached on the circuit board.

As already pointed out above, it is feasible in a simple manner, after having provided the circuit board with a plurality of contact or connection sites, to make the at least one intermediate layer for disentanglement available for an electronic component to be subsequently attached.

For a reliable formation of the intermediate layer comprising, in particular, very fine or ultra-fine conductive tracks or structures, it is, moreover, proposed that the structuring of the intermediate layer is performed by subtractive techniques, semi-additive techniques, additive techniques and/or embossing techniques or laser structuring techniques known per se, as in correspondence with a preferred embodiment of the process for producing the intermediate layer for disentanglement according to the invention.

For receiving, or fulfilling the function of a support for, an electronic component to be subsequently attached to the circuit board upon interposition of the intermediate layer for disentanglement, it is proposed according to a further preferred embodiment that, after the structuring of the intermediate layer, an additional support layer for the attachment or contacting of the electronic component is applied on the intermediate layer for disentanglement and provided with contacts for the electronic component.

As already mentioned above, it may preferably be provided according to the invention, particularly in consideration of the fact that the intermediate layer for disentanglement merely contains very fine or ultra-fine conductive tracks or structures in addition to the contact zones to be provided for contacting with the electronic component as well as the circuit board, that the intermediate layer is formed with a thickness reduced relative to the thickness of a circuit board layer.

In this connection, it is proposed according to a particularly preferred embodiment that the thickness of the intermediate layer is selected to be less than half, in particular less than a third, of the thickness of a circuit board layer. It is, thus, feasible to do, for instance, with intermediate layers having dielectric film thicknesses of below, e.g. 35 to 40 µm, in particular down to 10 µm or less, while a typical dielectric film thickness of an HDI circuit board amounts to at least 60 µm, e.g. more than 80 µm.

For the disentanglement of the junction, or contact or connection sites of the electronic component, very fine or ultra-fine conductive structures will do in the intermediate layer, wherein it is proposed in this respect according to a further preferred embodiment that the intermediate layer is provided with conductive tracks or conductive structures whose widths are selected to be less than 50 µm, in particular less than 30 µm.

As already indicated above, it is feasible according to a further preferred embodiment, in particular with a view to further reducing costs and simplifying the formation and attachment of the electronic component, that the intermediate layer is used as a support and/or enclosure for the electronic component.

To achieve the initially mentioned objects, a system including a circuit board and at least one electronic component, moreover, is essentially characterized in that at least one intermediate layer for the disentanglement of contact or connection sites of the electronic component from contact or connection surfaces of the circuit board is arranged or formed between the contact or connection sites of the electronic component and the contact or connection surfaces of the circuit board, and that the contact or connection sites of the electronic component comprise mutual distances reduced relative to the contact or connection sites of the circuit board. It is, thus, feasible to ensure disentanglement merely by providing at least one intermediate layer having a comparatively small thickness, said intermediate layer being preferably provided or providable merely partially in the region of the contact or connection surfaces of the circuit board and of the contact or connection sites of the electronic component to be connected therewith, as already indicated above.

According to a preferred embodiment, it is proposed in this respect that the intermediate layer is formed with conductive tracks or structures between contact zones corresponding to the contact or connection sites of the electronic component and corresponding to the contact or connection surfaces of the circuit board.

To simplify the attachment and contacting of the electronic component, it is, moreover, proposed that an additional support layer for the attachment and contacting of the electronic component is applied on the intermediate layer for disentanglement and provided with contacts for the electronic component, as in correspondence with a further preferred embodiment of the system according to the invention.

As already indicated several times, it may preferably be provided that the intermediate layer is formed with a thickness reduced relative to the thickness of a circuit board layer, wherein it is proposed according a particularly preferred embodiment that the thickness of the intermediate layer is less than half, in particular less than a third, of the thickness of a circuit board layer.

In addition, it is preferably proposed that the intermediate layer is provided with conductive tracks or conductive structures whose widths are less than 50 µm, in particular less than 30 µm.

For the use of unpackaged electronic components and in order to facilitate the attachment to a circuit board and contacting with the same, it is proposed according to a further preferred embodiment that the intermediate layer is used as a support and/or enclosure for the electronic component.

As already indicated several times, the intermediate layer for disentanglement according to the invention is preferably usable, in particular, in connection with a circuit board having a plurality of circuit board layers, wherein it is, moreover, proposed that the circuit board in a manner known per se is formed with a plurality of superimposed circuit board layers which are at least partially interconnected by conductive passages or microvias connecting individual circuit board layers, as in correspondence with a further preferred embodiment of the system according to the invention.

SHORT DESCRIPTION OF THE DRAWINGS

In the following, the invention will be explained in more detail by way of exemplary embodiments schematically illustrated in the accompanying drawing. Therein.

DETAILED DESCRIPTION OF PREFERRED EMBODIMENTS

Figure 1:
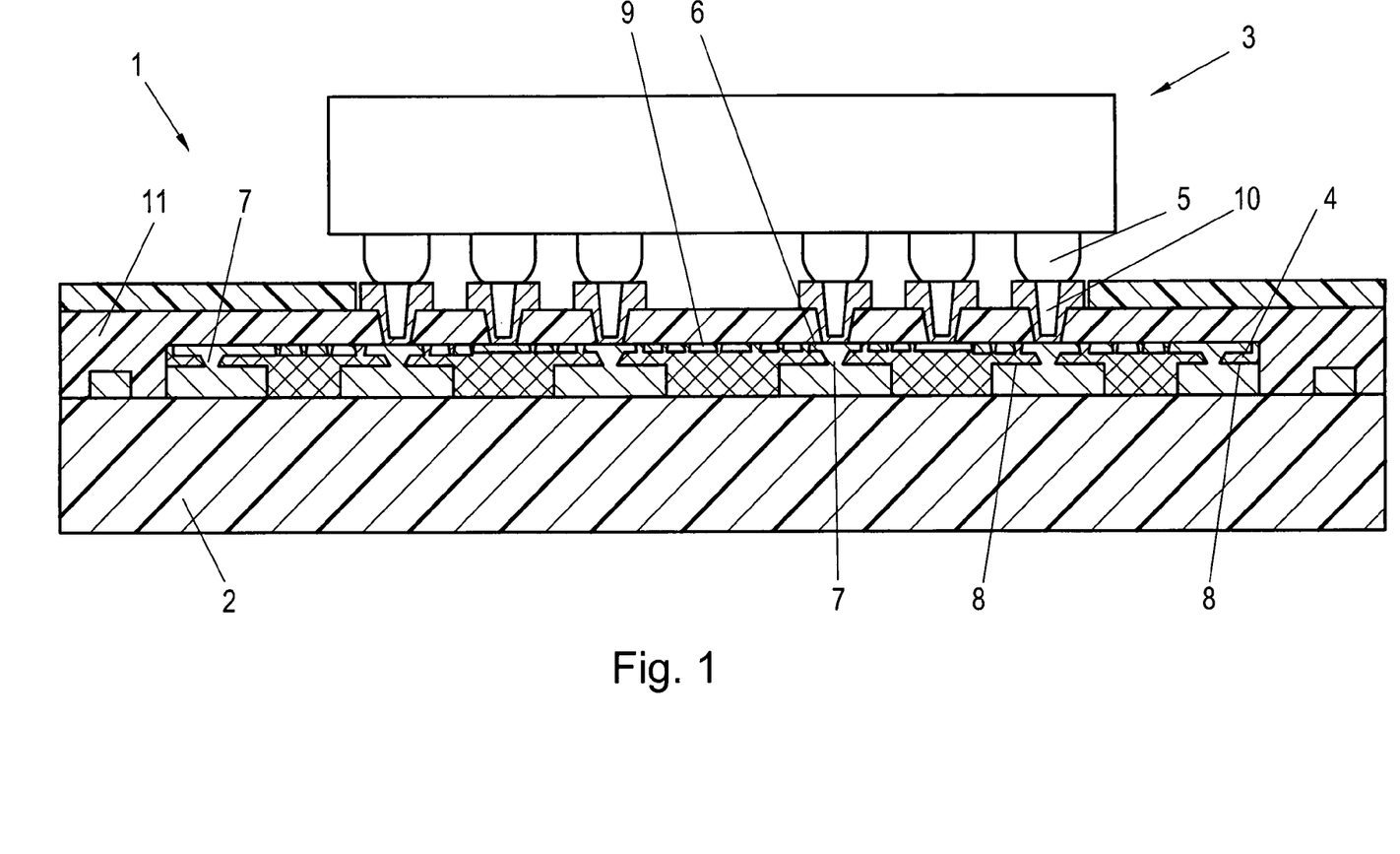
FIG. 1 is a partial section through a system according to the invention, which is comprised of a circuit board and an electronic component attached thereto, using an intermediate layer according to the invention for disentanglement.

FIG. 1 schematically illustrates a system 1 which is comprised of a printed circuit board, in particular an HDI board 2 having a plurality of board layers, and an electronic component 3 to be contacted with, and attached to, the former with an intermediate layer 4 for disentanglement arranged between the electronic component 3 and the circuit board 2.

As is apparent from FIG. 1, the intermediate layer 4 comprises a plurality of contact or connection zones 6 corresponding to the number of contact or connection sites of the electronic component 3, which contact or connection zones 6 are either substantially directly coupled with contact or connection zones 7 corresponding to contact or connection surfaces 8 provided on the circuit board 2. From FIG. 1, it is apparent that the distances between neighboring contact or connection sites 5 of the electronic component 3 are smaller than the distances between neighboring contact or connection surfaces 8 of the circuit board 2 such that, for a disentanglement in the intermediate layer 4, very fine or ultra-fine conductive tracks or conductive structures are additionally included to provide connections with further contact or connection zones 7 of the intermediate layer 4, via which contacting with connection or contact surfaces 8 of the circuit board 2 is subsequently effected.

As opposed to the known prior art, where immediate contacting between the connection or contact sites or connections 5 of the electronic component 3 with the associated connection or contact surfaces 8 of the circuit board 2 is realized, optionally by providing conductive passages or microvias for the disentanglement of the connection or contact sites 5 of the highly complex electronic component 3, the configuration according to FIG. 1 ensures complete disentanglement via the intermediate layer 4.

In the configuration according to FIG. 1, the intermediate layer 4 for disentanglement is merely provided in the region of the contact or connection sites 5 of the electronic component 3 as well as the connection or contact surfaces 7 of the circuit board 2 such that a partial formation of the intermediate layer 4 will do.

Moreover, the thickness of the intermediate layer is not represented to scale relative to the size or dimensions of both the circuit board 2 and the electronic component 3 in any of the Figures. Taking into account the very fine or ultra-fine conductive tracks or conductive structures 9, which may, for instance, have widths of less than 50 µm, e.g. about 25 µm, a thickness of the dielectric film for the intermediate layer 4 in the order of about 35 µm will do, this being less than half of the usual thickness of the dielectric film of a board layer of a circuit board 2. Moreover, thicknesses for the dielectric film of the intermediate layer 4 of up to 10 µm or therebelow are usable or applicable.

The circuit board 2 illustrated in the Figures is, moreover, for instance, comprised of a plurality of circuit board layers, which are, however, not illustrated or indicated separately.

In the embodiment represented in FIG. 1, contacting between the intermediate layer 4 for disentanglement and the connection or contact sites 5 of the component 3 is realized via conductive contacts 10, which are received or provided in a carrier layer or support structure schematically indicated by 11.

Instead of the merely partial arrangement of the intermediate layer 4 for disentanglement in correspondence with the contact or connection surfaces 8 of the circuit board 2 as well as the contact or connection sites 5 of the electronic component 3, the intermediate layer 4 and, in particular, the base material of the same may be applied or provided substantially all-over the surface of the circuit board 2, the respective structuring with the contact zones 6 and 7, respectively, as well as the conductive tracks 9 being merely provided or formed in the region of the attachment or contacting of the or an electronic component 3 on the circuit board 2.

Figure 2:
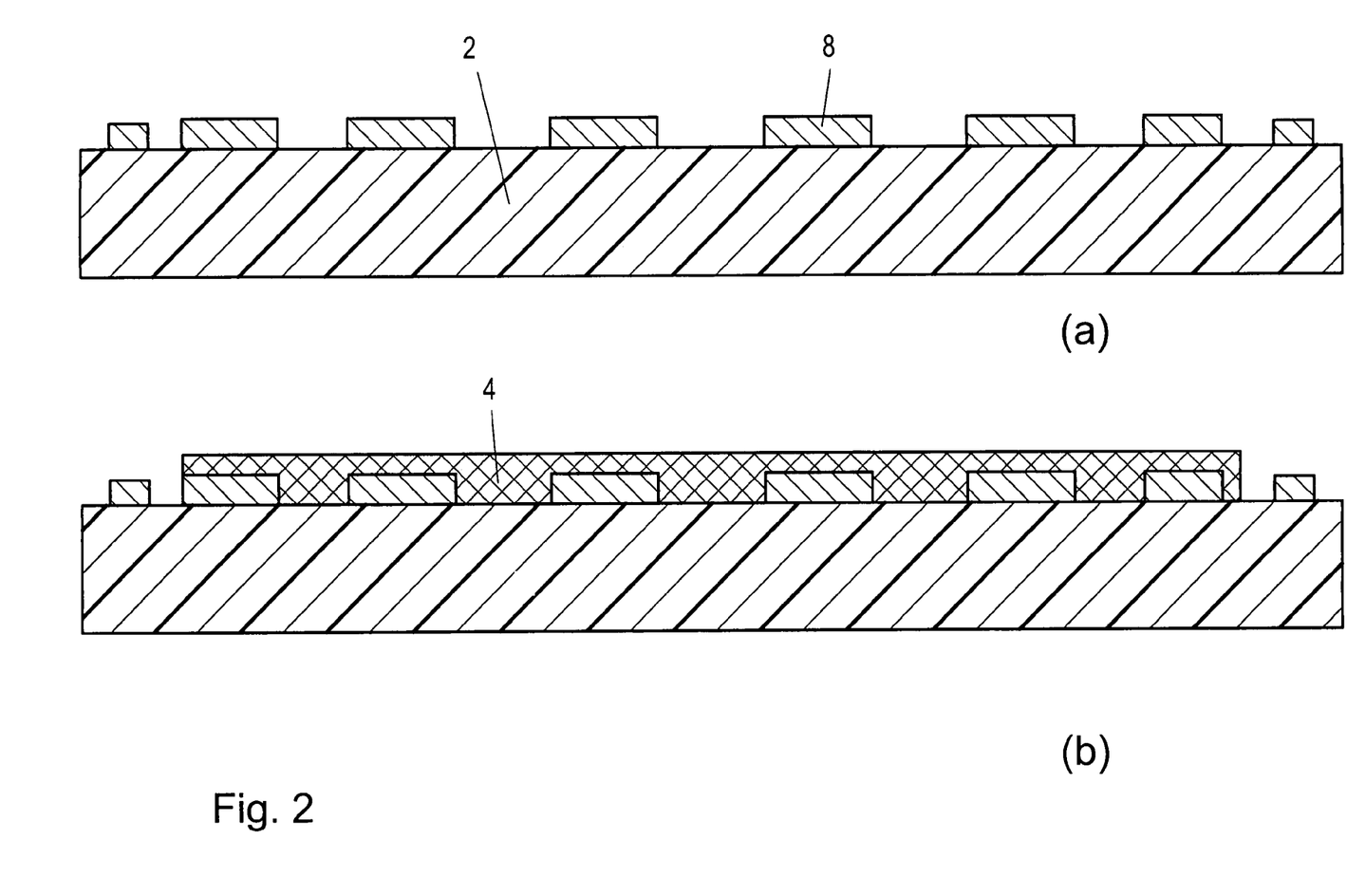
FIG. 2 schematically illustrates individual steps for carrying out the process according to the invention for attaching an electronic component to a circuit board while forming or arranging an intermediate layer for disentanglement.

FIG. 2 schematically depicts a process sequence for producing a system 1 comprised of a circuit board and an electronic component, while using or forming an intermediate layer 4 for disentanglement.

In step (a), a circuit board, in particular a HDI board 2, is provided, wherein appropriate connection or contact surfaces 8 are already formed and indicated.

In step (b), a base material for the intermediate layer 4 is applied, whereupon in step (c) the structuring of the contact or connection zones 6 and 7, respectively, as well as the conductive tracks 9 of the intermediate layer 4 is performed, an exemplary process for structuring the intermediate layer 4 being discussed below with reference to FIG. 3.

Following the structuring or formation of the intermediate layer 4 for disentanglement, the application of additional plies or support layers 11 and 12 is effected in step (d), whereupon, according to step (e), the structuring and finishing of the support layers or plies 11 and 12 is carried out, for instance by providing contacts 10.

Finally, in step (f), the electronic component 3 is coupled or connected to the intermediate layer 4 for disentanglement, and subsequently with the circuit board 2, via the connection or contact sites 5, while interposing contacts 10.

Figure 3:
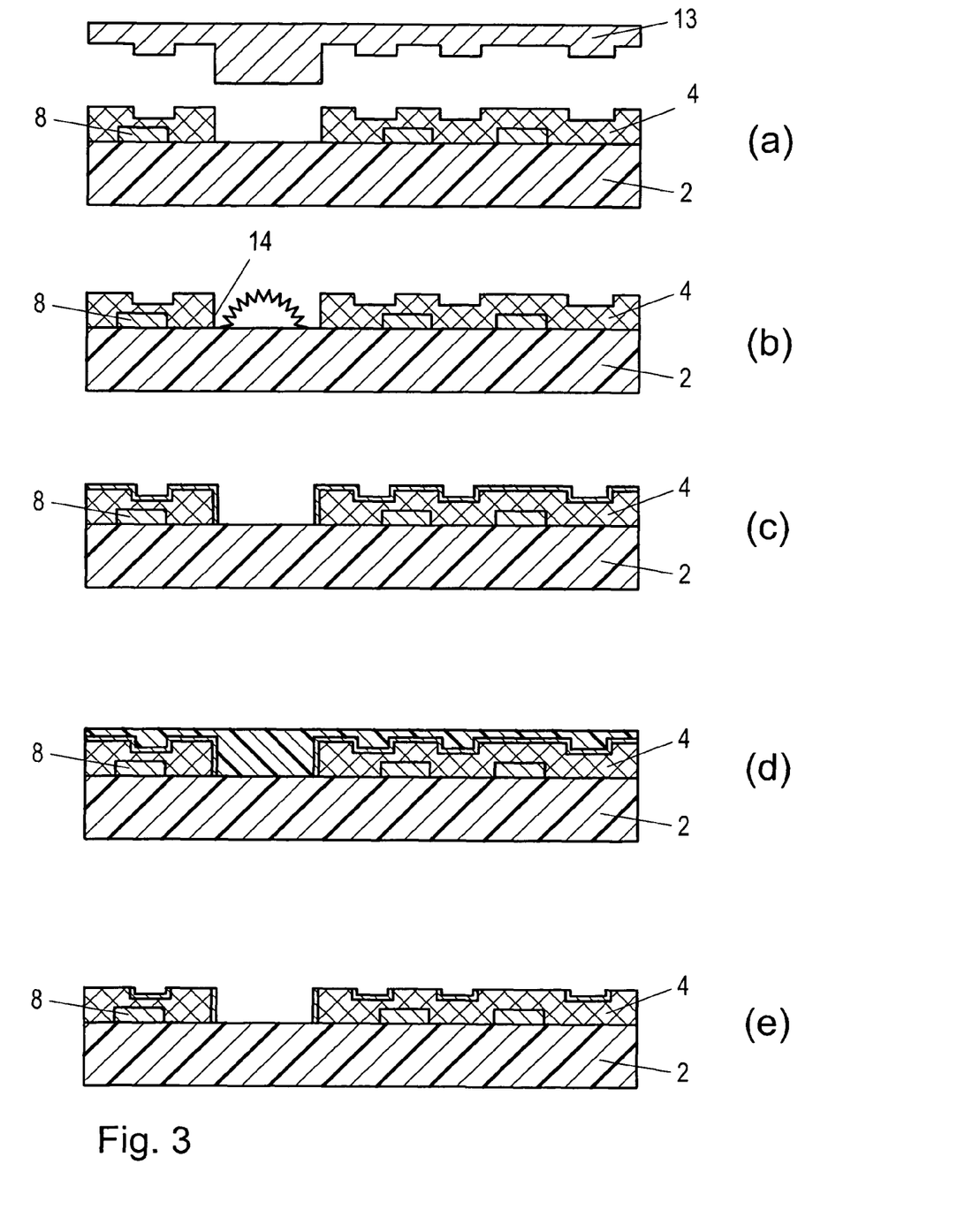
FIG. 3 schematically illustrates individual process steps for forming an intermediate layer for disentanglement to be used in the process according to the invention and in the system according to the invention, respectively.

FIG. 3 schematically illustrates the partial steps of a process for structuring or forming an intermediate layer 4, using, for instance, an embossing technique known per se. It should further be noted that, for the formation or structuring of the intermediate layer 4 for disentanglement, structuring is merely performed on just one side as opposed to the double-sided structuring of an extremely fine conductor structure generally indicated in FIG. 3.

In step (a) according to FIG. 3, embossing of the intermediate layer 4 is carried out using, for instance, an embossing tool 13 to emboss a relief structure on a thermo-plastic foil.

In step (b), possibly remaining residual materials are, for instance, removed by reactive ion etching in order to enable the production of throughgoing holes or microvias 14, whereupon, according to step (c), the application of a seed layer of a thin, conductive material is realized over the entire surface. Such an application may, for instance, be effected by sputtering or thermal vapor deposition.

After this, the relief structure is coppered according to step (d), and the projecting copper built up by the galvanization process is removed in step (e), for instance by chemical or mechanical processes, so as to enable, as a function of the desired structure of the intermediate layer 4, the formation of contact zones 6 and 7 according to the positions of the contact or connection sites 5 of the electronic component 3 and the contact or connection surfaces 8 of the circuit board 2 as well as the required ultra-fine conductive tracks 9.

For the production of the intermediate layer 4, thermoplastic materials like, e.g., polyetherimide, liquid crystal polymer (LCP) may be used.

Alternatively to the use of thermoplastic materials, thermally or UV-curable materials may be employed for the structuring of the intermediate layer 4.

Furthermore, the application of a conductive layer described in steps (c) and (d) may be replaced with the filling of the depressions or recesses with a conductive material.

Instead of using an embossing technique, the removal of the polymer material used for the intermediate layer 4 may, for instance, be done by the aid of laser light.

For the structuring of the circuit board or the arrangement of the conductive connection or contact zones 6 and 7, respectively, as well as the conductive tracks 9, known subtractive techniques, semi-additive techniques or additive techniques may, moreover, be employed.

In the exemplary embodiments illustrated in FIGS. 4 to 7, the reference numerals of the preceding Figures, in particular those of FIG. 1, have been retained for identical components.

Figure 4:
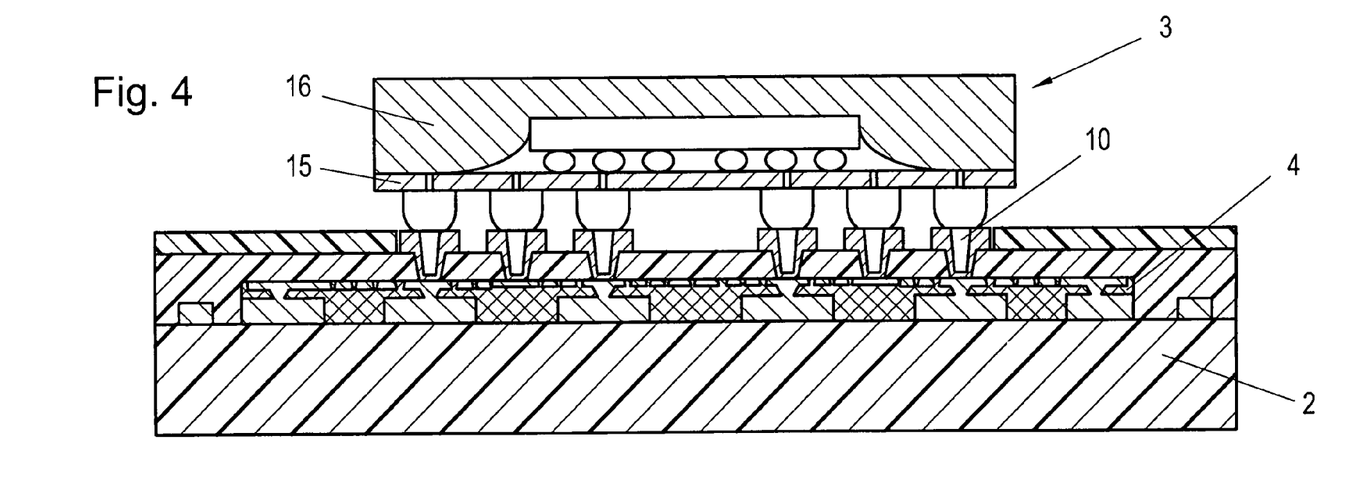
FIG. 4, in an illustration similar to that of FIG. 1, depicts in detail an electronic component of a system according to the invention, on a scale reduced relative to that of FIG. 1.

According to the illustration of FIG. 4, the attachment of the electronic component 3 is again realized via contacts 10 on the intermediate layer 4 for contacting with the circuit board 2, wherein FIG. 4, in addition, depicts the electronic component 3 in greater detail, from which it is, in particular, apparent that the latter is arranged on a plate-shaped support structure 15 and surrounded by a sheathing 16.

Figure 5:
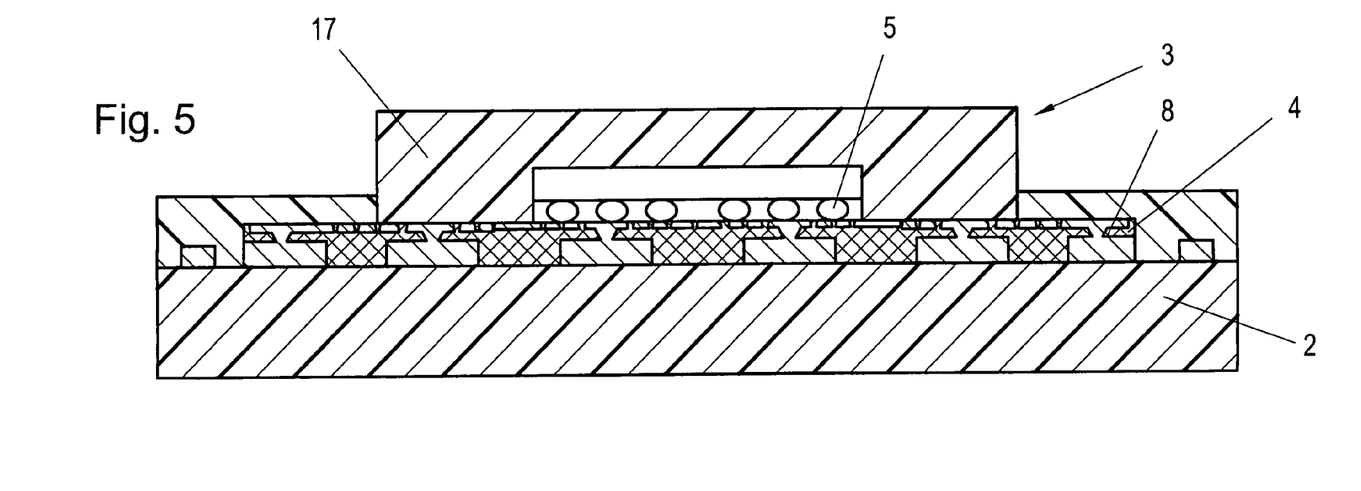
FIG. 5, in an illustration similar to that of FIG. 4, depicts a further modified embodiment of a system according to the invention, with an unpackaged electronic component being integrated.

From the modified illustration according to FIG. 5, it is apparent that an electronic component again denoted by 3 is inserted without the support structure and sheathing structure 15 and 16, respectively, illustrated in FIG. 4, but is directly connected or coupled, via connection or contact sites again denoted by 5, with the respective contact zones 6 of the intermediate layer 4 for disentanglement, via which a connection or junction to the circuit board again denoted by 2 is subsequently realized via the connection or contact surfaces 8.

In the configuration according to FIG. 5, the intermediate layer 4 for disentanglement, moreover, serves directly as a support structure and, hence, fulfils a supporting or carrying function for the electronic component 3 such that additional contacts may be obviated. This results in a reduction of costs and, at the same time, an enhanced connection of the electronic component 3 to the intermediate layer 4 and, hence, to the circuit board 2.

For the proper fixation and protection of the unpackaged component 3, a sheathing 17 surrounding the electronic component 3 and supported on the intermediate layer 4 for disentanglement is indicated in the embodiment according to FIG. 5.

Figure 6:
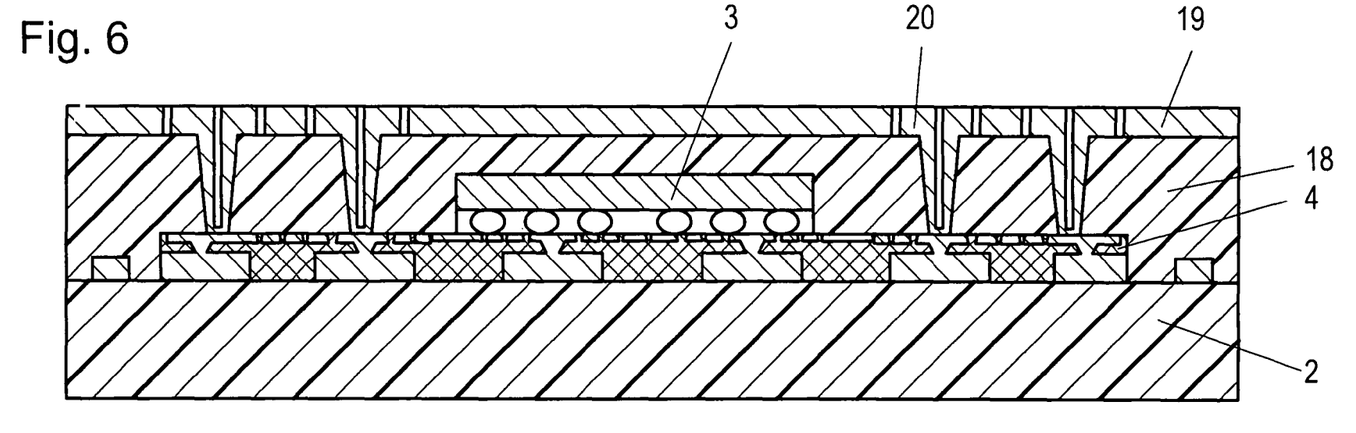
FIG. 6, in an illustration similar to those of FIGS. 4 and 5, depicts a further modified embodiment of a system according to the invention, with the electronic component being directly applied on the intermediate layer for disentanglement.

In the embodiment according to FIG. 6, an unpackaged electronic component 3 is employed, which is directly coupled with the intermediate layer 4 for disentanglement. Further layers 18 and 19 are indicated above the component 3, wherein, in particular in the region of these layers, additional contacts or connections 20 are indicated, which serve for the attachment of further components not shown in FIG. 6. The contacting of such further components via the connections or contacts 20 in the embodiment illustrated in FIG. 6 is again realized upon interposition of the intermediate layer 4 for disentanglement.

Figure 7:
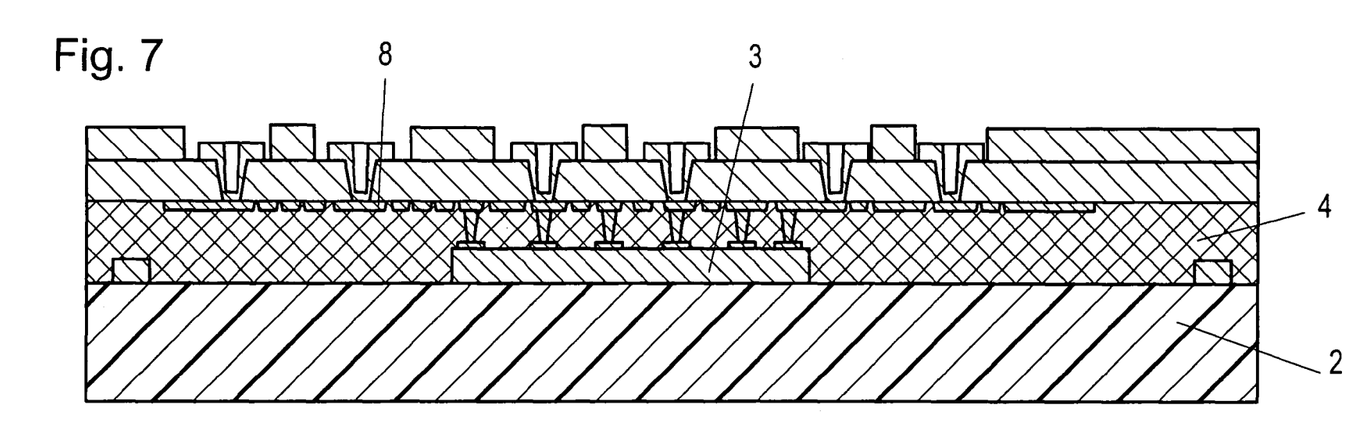
FIG. 7, in an illustration again similar to those of FIGS. 4 to 6, depicts a further modified embodiment of the system according to the invention, with the intermediate layer for disentanglement being applied on a component integrated in the circuit board.

In the embodiment represented in FIG. 7, the electronic component 3 is arranged with the connection or contact sites facing away from the circuit board 2, the intermediate layer 4 for disentanglement being arranged above the electronic component 3 and subsequent contacting being again effected with connection or contact surfaces 8 of the circuit board 2. In the embodiments according to FIGS. 6 and 7, an integration of the electronic component 3 is, thus, immediately enabled, this resulting in a further integration of embedded components and an increased compactness at the simultaneous reduction of the overall size of the system.

By using the intermediate layer 4 for disentanglement between the connection or contact sites 5 of the electronic component 3 and also the contact or connection surfaces 8 of the circuit board 2, an intermediate layer 4 having a reduced thickness, in particular in respect to the dielectric layer, particularly as compared to the thickness of usual circuit board layers, will thus, be enough such that, in the main, only a negligible increase in the thickness of the overall circuit board will occur.

Furthermore, a single intermediate layer 4 for disentanglement will do in most cases, said intermediate layer 4, as opposed to usual circuit board layers, for disentanglement only comprising contact zones 6 and 7 as well as very fine or ultra-fine conductive tracks or conductive structures 9 which are adaptable to the small distances of connections or connection sites 5 of highly complex electronic components 3, without requiring a plurality of layers and, in particular, additional circuit board layers for the disentanglement of such highly complex components 3.

When using electronic components 3 comprising extremely large numbers of connection or contact sites, whose number may range from some hundreds to some thousands, it may, moreover, be provided that a further intermediate layer is applied or deposited on an intermediate layer 4, for instance according to the process schematically illustrated in FIG. 3, wherein appropriate feedthroughs or microvias are provided for contacting with the circuit board 2 arranged therebelow, or the circuit board layers forming the circuit board 2. Bearing in mind the fact that the thickness of such an optionally required, additional intermediate layer 4 is again strongly reduced as compared to the thickness of an additional circuit board layer and, in particular, its dielectric layer, and further bearing in mind that, due to the simplified structuring of such an intermediate layer 4 for disentanglement, the latter substantially comprises but very fine or ultra-fine conductive track structures 9, a negligible increase in the overall thickness of the circuit board 2 along with the intermediate layers 4 will do even if more than one intermediate layer 4 is provided for disentanglement in the region of highly complex components 3. By contrast, it will have to be taken into account that, with an optionally sought disentanglement via additional circuit board layers, the number of circuit board layers will have to be considerably increased on account of the more complex structures of the latter as compared to the simple structure of the intermediate layer 4 such that an accordingly high increase in the overall thickness of the circuit board 2 as well as the production costs will be involved.

In addition, the arrangement of the thin intermediate layer 4 renders feasible the provision of larger connection sites or zones so as to meet the requirements of a registering accuracy of the individual layers even when using large-sized production formats of printed circuit boards and, in particular, HDI boards. The tapering or conically shaped bores provided in the region of passages will require little space considering the thickness reduction, thus lowering the requirements of a registration or orientation accuracy.

The invention claimed is:

1. A process for attaching an electronic component on a circuit board or contacting the electronic component with the circuit board, comprising the steps of:
   providing the circuit board with a plurality of contact or connection surfaces;
   providing the electronic component with a number of contact or connection sites corresponding to the plurality of contact or connection surfaces of the circuit board, at mutual distances reduced relative to the distances of the contact or connection surfaces of the circuit board; and
   forming between the contact or connection surfaces of the circuit board and the contact or connection sites of the electronic component at least one intermediate layer for disentangling the contact or connection sites of the electronic component;
   wherein, after the structuring of the intermediate layer, an additional support layer for the attachment or contacting of the electronic component is applied on the intermediate layer for disentanglement and provided with contacts for the electronic component;
   wherein the additional support layer covers both the intermediate layer and portions of the circuit board;

wherein the intermediate layer is merely formed in the region of the contact or connection surfaces of the circuit board as well as the contact or connection sites of the electronic component; and wherein the intermediate layer is created as a part of a substrate of the circuit board by adding a layer to the circuit board.

2. The process according to claim 1, wherein the intermediate layer is formed with conductive tracks or structures between contact zones corresponding to the contact or connection sites of the electronic component and corresponding to the contact or connection surfaces of the circuit board.

3. The process according to claim 1, wherein contacting between the contact or connection sites of the electronic component and the intermediate layer is effected via contacts of the electronic component.

4. The process according to claim 1, wherein contact or connection sites of the electronic component are directly contacted with contact zones of the intermediate layer.

5. The process according to claim 1, wherein the electronic component is attached on the circuit board with contact or connection sites oriented away from the circuit board, and is overlaid by the intermediate layer for disentanglement and connection to the contact or connection surfaces of the circuit board.

6. A process for producing an intermediate layer for disentangling contact or connection sites of an electronic component from contact or connection surfaces of a circuit board, comprising the steps of:

providing the circuit board with a plurality of contact or connection surfaces;

forming a base material of the intermediate layer merely in the region of the contact or connection surfaces of the circuit board;

structuring the intermediate layer to form conductive tracks or structures and contact sites for contacting with contact or connection surfaces of the circuit board and with contact or connection sites of an electronic component to be attached on the circuit board;

wherein, after the structuring of the intermediate layer, an additional support layer for the attachment or contacting of the electronic component is applied on the intermediate layer for disentanglement and provided with contacts for the electronic component;

wherein the additional support layer covers both the intermediate layer and portions of the circuit board; and wherein the intermediate layer is created as a part of a substrate of the circuit board by adding a layer to the circuit board.

7. The process according to claim 6, wherein the structuring of the intermediate layer is performed by subtractive techniques, semi-additive techniques, additive techniques or embossing techniques or laser structuring techniques.

8. The process according to claim 6, wherein the intermediate layer is formed with a thickness reduced relative to the thickness of a circuit board layer.

9. The process according to claim 8, wherein the thickness of the intermediate layer is selected to be less than half, in particular less than a third, of the thickness of a circuit board layer.

10. The process according to claim 6, wherein the intermediate layer is provided with conductive tracks or conductive structures whose widths are selected to be less than 50 µm.

11. The process according to claim 6, wherein the intermediate layer is used as a support or enclosure for the electronic component.

12. A system including a circuit board and at least one electronic component, wherein at least one intermediate layer for the disentanglement of contact or connection sites of the electronic component from contact or connection surfaces of the circuit board is formed between the contact or connection sites of the electronic component and the contact or connection surfaces of the circuit board, and that the contact or connection sites of the electronic component comprise mutual distances reduced relative to the contact or connection sites of the circuit board; wherein an additional support layer for the attachment and contacting of the electronic component is applied on the intermediate layer for disentanglement and provided with contacts for the electronic component; wherein the intermediate layer is merely formed in the region of the contact or connection surfaces of the circuit board as well as the contact or connection sites of the electronic component; wherein the additional support layer covers both the intermediate layer and portions of the circuit board; and wherein the intermediate layer is created as part of a substrate of the circuit board by adding a layer to the circuit board.

13. The system according to claim 12, wherein the intermediate layer is formed with conductive tracks or structures between contact zones corresponding to the contact or connection sites of the electronic component and corresponding to the contact or connection surfaces of the circuit board.

14. The system according to claim 12, wherein the intermediate layer is formed with a thickness reduced relative to the thickness of a circuit board layer.

15. The system according to claim 14, wherein the thickness of the intermediate layer amounts to less than half of the thickness of a circuit board layer.

16. The system according to claim 12, wherein the intermediate layer is provided with conductive tracks or conductive structures whose widths are less than 50 µm.

17. The system according to claim 12, wherein the intermediate layer is used as a support or enclosure for the electronic component.

18. The system according to claim 12, wherein the circuit board is formed with a plurality of superimposed circuit board layers which are at least partially interconnected by conductive passages or microvias connecting individual circuit board layers.

19. The process according to claim 6, wherein the intermediate layer is provided with conductive tracks or conductive structures whose widths are selected to be less than 30 µm.

20. The system according to claim 14, wherein the thickness of the intermediate layer amounts to less than a third of the thickness of a circuit board layer.

21. The system according to claim 12, wherein the intermediate layer is provided with conductive tracks or conductive structures whose widths are less than 30 µm.

* * * * *

UNITED STATES PATENT AND TRADEMARK OFFICE
CERTIFICATE OF CORRECTION

PATENT NO. : 8,541,690 B2  Page 1 of 1
APPLICATION NO. : 12/227364
DATED : September 24, 2013
INVENTOR(S) : Voraberger et al.

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 869 days.

Signed and Sealed this
Fifteenth Day of September, 2015

Michelle K. Lee
*Director of the United States Patent and Trademark Office*